United States Patent [19]
Kahn et al.

[11] Patent Number: 5,663,633
[45] Date of Patent: Sep. 2, 1997

[54] TOUCH CONTROL FAN AND METHOD

[75] Inventors: Jerry Kahn, Wellesley; Neville R. Glenn, Milford, both of Mass.

[73] Assignee: Holmes Products Corp., Milford, Mass.

[21] Appl. No.: 574,816

[22] Filed: Dec. 19, 1995

Related U.S. Application Data

[63] Continuation-in-part of Ser. No. 275,538, Jul. 15, 1994, abandoned.

[51] Int. Cl.[6] .................................................. G05F 1/00
[52] U.S. Cl. ........................... 323/218; 323/211; 323/904; 327/110
[58] Field of Search ........................ 323/904; 315/362; 200/52 R, 600; 307/116, 126; 327/110

[56] References Cited

U.S. PATENT DOCUMENTS

| | | | |
|---|---|---|---|
| Re. 33,285 | 7/1990 | Kunen | 307/116 |
| 4,211,959 | 7/1980 | Deavenport et al. | 315/362 |
| 4,289,972 | 9/1981 | Wern | 307/115 |
| 4,672,229 | 6/1987 | Skarman et al. | 307/115 |
| 4,988,924 | 1/1991 | Maurer et al. | 315/291 |
| 5,473,202 | 12/1995 | Mudge et al. | 307/116 |

*Primary Examiner*—Peter Wong
*Assistant Examiner*—Shawn Riley
*Attorney, Agent, or Firm*—Hoffmann & Baron, LLP

[57] ABSTRACT

A control circuit for an electrical appliance having an inductive load includes a signal conditioning element, a control element, a power conditioning element, a power adjustment element, and a switching element. The control circuit is sensitive to input received from a sensor which in turn is sensitive to a touch on an outside of a conductive casing of the appliance or a sharp sound. A separate touch pad is used if the appliance has a non-conductive casing. The load is typically a motor for driving a fan unit. The fan unit may be used either independently or as part of an appliance such as a humidifier, dehumidifier, heater, or air purifier.

15 Claims, 8 Drawing Sheets

TOUCH CONTROL FAN AND METHOD

This is a continuation-in-part of application Ser. No. 08/275,538 filed Jul. 15, 1994 now abandoned.

BACKGROUND OF THE INVENTION

This invention relates generally to a control circuit for small electrical appliances which have an inductive load. In particular, this invention concerns a touch control circuit for a fan motor, used either in a stand-alone fan or in an appliance incorporating a fan.

Fans are well known in the art and are commonly used both independently to circulate air and in conjunction with other small appliances such as heaters, humidifiers, and air purifiers to effectuate the underlying function of the appliance. Conventional fans and small appliances which use fans typically utilize switches that require manual manipulation for adjusting the power intensity of the fan unit. In other industries and for other household products with typically resistive loads, such as lighting fixtures, there has arisen a body of technology for providing a variety of touch control switches. These range in sensitivity from a light touch (or even close proximity) to being sensitive only to firm pressure. Technically there are various capacitive, resistive, and inductive types of switches as well as other forms providing a greater degree of remoteness in control (as using infra-red or ultrasonics, or audio (the clapper) which are known in the field of switch technology. Some of these approaches have been used to control the power state within lamps and large appliances. Some of these approaches, as applied to touchscreen computer displays, are compared in an article entitled "Touchscreens are changing the face of computers" in *Electronic Products* November, 1994 pp. 63-70 incorporated herein by reference.

U.S. Pat. No. 5,166,482 to Li, dated Nov. 24 1992, discloses an external, remote touch control lamp switch that includes an outer shell, a touch-control metal panel over the outer shell, a control circuit board fastened inside the outer shell to receive a touch-control signal from the panel, and a socket fastened in the outer shell to connect to the male prongs in a lamp plug and to transmit an ON/OFF signal to the lamp responsive to a touch. Such a switch is remote to the lamp, however, and was motivated by the inconveniences and structural problems associated with common internal touch control lamp switches.

U.S. Pat. No. 4,668,876 to Skarman, dated May 26, 1987, correspondingly discloses a remote touch control switch and lamp system that includes a remote touch control circuit with an electrical lead connected to a conductive portion of a lamp or lamp housing. A special type of lamp cord is required, however, for proper operation of the switch and lamp system. Although lamps are the primary disclosed devices that are used in combination with the remote switch, Skarman also briefly suggests that the remote switch may be adapted to be used in conjunction with a fan. There is no suggestion or hint, however, of a fan having an integrally mounted touch control switch. Moreover, Skarman specifically teaches away from an internal switch used in combination with a lamp or any other electrical appliance. Such a combination as mentioned in Skarman would require additional modification of the lamp or appliance, something Skarman wishes to avoid.

For light (soft) touch control, there are a number of options presented in the literature for controlling lamps. A typical control circuit consists of several elements as disclosed in U.S. Pat. No. 4,831,279 to Ingraham and U.S. Pat. No. 3,666,988 to Bellis, both incorporated herein by reference, of an oscillator which is set so that the frequency of oscillation is changed for a change in input capacitance or voltage. Some such circuits generally also incorporate a triac for electronically switching moderate power levels. See, for instance, U.S. Pat. No. 4,701,676 to Gibson, and Galloway "Using the Triac for Control of AC Power", General Electric Application Note No. 200.35, March 1966, p. 16. However, switching modes disclosed (as in Gibson) require complex electronics and timing circuits.

In one instance, primarily for a light control application (U.S. Pat. No. 4,701,676 to Gibson), a means for balancing impedances on the input side of the touch control circuitry is disclosed. This disclosure does not extend to suggesting a need to balance impedances on the output side of the control circuitry.

With respect to the point of contact, there are several options. One option is to have the whole appliance or lamp itself be conducting and serve as the point of contact. This approach presents a risk of electrical shock. A second option is to have a special metallic conducting plate located on the appliance. A third option is to have a non-metallic material connected to the input of a capacitively linked sensor circuit. Examples of this are given in the following.

U.S. Pat. No. 4,665,040 to Ogino et. al., dated May 12, 1987, discloses a specific touch control switch for electrical appliances. Ogino teaches the internal structure of a type of switch as it discloses the use of the switch as merely for use in conjunction with electric appliances. There is no suggestion to utilize the disclosed switch, nor any similar switch, internally in combination with a motor or appliance which uses an inductive load such as a fan.

U.S. Pat. No. 4,380,040 to Posset, dated Apr. 12, 1983, also discloses a specific type of switch for use in touch control systems. In like manner to Ogino, Posset discloses the internal structure of a type of switch as it teaches its use in touch control systems. Again, there is no suggestion to utilize the switch internally singularly or in combination with small appliances such as fan motors which may have varying degrees of inductances, capacitances and other phase-shifting configurations.

U.S. Pat. No. 4,119,864 to Petrizio, incorporated herein by reference, suggests two means to signal the system of one's intentions regarding different power levels. The two means are by the length of time a touch switch is actuated, and by the number of times it is actuated. Neither of these approaches are specifically applied to appliances of the type identified in the present invention.

In summary, there are a number of switching systems described in the literature. The approaches may be distinguished as:

(1) switches remote to the appliance versus switches integral to the appliance;

(2) switches for single power mode (ON or OFF) versus switches to provide multiple levels;

(3) systems without signal conditioning versus systems with signal conditioning; and (4) electro-mechanical switches versus electronic or solid state switches.

Electronic or solid state switches usually consist of a signal detection stage and a signal conditioning stage. Signal conditioning to reduce false triggering from spurious voltage fluctuations may be as simple as an R-C filter or as complex as using comparators or timing sequences. The signal detection stage for electronic switches falls into one of three broad classes:

Class 1, those activated by pressure (as changing the capacitance by decreasing the distance between conducting plates or changing the resistance of a capsule of conducting elements);

Class 2, those activated by the introduction of an outside capacitance or voltage source (as from a person acting as an antenna for electromagnetic signals); and Class 3, those activated by a change in inductance brought about by the introduction of objects into an electromagnetic field.

In the latter instance, no physical contact is required to have "touch" control. In Class 1, by contrast, substantial pressure is frequently required. In Class 2, a very light touch or a very close nearness is sufficient. For reasons of economy, functionality, and simplicity, we determined to create an invention of the Class 2 type. We discovered that referenced circuits used for the control of lighting often failed when trying to control motors as used in fans, because depending upon the motor type, there were capacitive or inductive loads which introduced phase shifts which interfered with operation of the solid state switches commercially available.

Accordingly, there is a need for a device that overcomes these problems, namely, a device which provides the combination of an internal fully integrated touch control system switch including signal conditioning, impedance matching, and power level adjustment which functions independently or in conjunction with other appliances.

Furthermore, the touch control switch offers advantages over the typical mechanical switch, since a mechanical switch is not convenient to operate, especially for disabled and otherwise handicapped people. Actually twisting or pushing a manual switch to operate a fan or other appliance is more than a mere inconvenience for the disabled and is often an impossibility. More broadly, heaters, cooling fans and other air treatment appliances are generally placed on the floor requiring one to bend over and to manipulate controls while in an awkward position. For these and other reasons, there is a need to provide alternatives to conventional electro-mechanical switches for control of household appliances.

OBJECTS AND SUMMARY OF THE INVENTION

It is therefore an object of the present invention to provide an improved touch control system for small electrical appliances which overcomes the limitations and drawbacks of the prior art.

Another object of the present invention is to switch inductive and capacitive loads by a touch.

It is a further object of the present invention to provide a small appliance that is easily used by disabled and otherwise handicapped people and by people for whom bending over or twisting is stressful.

The present invention is distinguished by being a unique combination of switches integral to the appliance having capability to provide multiple voltage levels to a motor drive, having both input and output signal conditioning options, and using electronic components for power switching and control.

This invention results from the realization that a small electrical appliance such as a fan or heater can be combined with an internal touch control system to control efficiently and conveniently the power level of the fan.

Briefly stated, a control circuit for an electrical appliance having an inductive load includes a signal conditioning element, a control element, a power conditioning element, a power adjustment element, and a switching element. The control circuit is sensitive to input received from a sensor which in turn is sensitive to a touch on an outside of a conductive casing of the appliance or a sharp sound. A separate touch pad is used if the appliance has a non-conductive casing. The load is typically a motor for driving a fan unit. The fan unit may be used either independently or as part of an appliance such as a humidifier, dehumidifier, heater, or air purifier.

According to an embodiment of the invention, a control circuit for an inductive load includes means for receiving an input from a sensor, means for filtering spurious signals in the input, means for conditioning, responsive to the means for filtering, an output power signal, the means for conditioning the output power signal including means for adjusting a phase and impedance of the output power signal to match the inductive load, means for controlling the means for conditioning the output power signal, and means for switching, responsive to the means for controlling, the output power signal for transferring the output power signal to the inductive load.

According to an embodiment of the invention, a sensor controlled electrical appliance includes an inductive load, a sensor, means for receiving an input from the sensor, means for filtering spurious signals in the input, means for conditioning, responsive to the means for filtering, an output power signal, the means for conditioning the output power signal including means for adjusting a phase and impedance of the output power signal to match the inductive load, means for controlling the means for conditioning the output power signal, and means for switching, responsive to the means for controlling, the output power signal for transferring the output power signal to the inductive load.

According to an embodiment of the invention, a control circuit for an inductive load includes means for receiving an input from a sensor, means for filtering spurious signals in the input, means for conditioning, responsive to the means for filtering, an output power signal, the means for conditioning the output power signal including means for adjusting a phase and impedance of the output power signal to match the inductive load, means for controlling the means for conditioning the output power signal, means for switching, responsive to the means for controlling, the output power signal for transferring the output power signal to the inductive load, the means for filtering spurious signals in the input including an RC network, the means for controlling including means for providing varying power levels of the output power signal, ranging from zero percent to 100 percent, to the inductive load, the means for controlling, responsive to the input, including means for changing voltage levels of the output power signal to the inductive load, the means for conditioning the output power signal including one of an active and passive network containing at least two of L, R, and C elements, and the network including means for altering a phase relationship between current and voltage in the output power signal.

The above and other objects are achieved in accordance with the present invention which, according to a first aspect, provides a touch control appliance comprising a base, a touch pad mounted upon an external surface of the base, a touch control circuit disposed within the base, and a motorized fan unit proximate the base. The touch control circuit, which receives power from a power supply and a power output, is in electrical communication with the touch pad and transmits power to the fan/motor unit. The circuit has a means to create "ON", "OFF", and intermediate states within the motor of the appliance which comprises the control of current flow through the solid state triac switch that changes power states when the touch pad is touched. The appliance can be adapted to be used on a flat surface, a window sill, suspended from a frame or mounted to a wall. The touch pad comprises a conductive or semi-conductive plate.

According to a second aspect of the invention, a method of controlling the operation of an appliance is disclosed, where the appliance has an internal touch pad, fan/motor unit, and a touch control circuit. The operation is controlled by touching the touch control pad and thereby imposing a change in voltage or current flow to the input circuit which in turn actuates the circuit to change the power state within the fan unit.

According to a third aspect of the invention, an appliance responsive to external contact is disclosed, comprising an electrical appliance, a conductive or semi-conductive plate permanently mounted to the fan unit, and a capacitive touch control system in electrical communication with both the conductive plate and the appliance. The switch is disposed within the fan unit, wherein the switch is actuated by touching the conductive or semi-conductive plate. The appliance includes a fan blade and a fan motor that is in electrical communication with the control switch.

According to a fourth aspect of this invention, a touch control fan for mounting within an appliance having an appliance casing with an external surface is disclosed. Such a fan comprises a touch pad mounted upon the external surface of the casing, a fan unit disposed within the casing, and a touch control circuit in electrical communication with the touch pad and the fan unit. The fan unit has a fan blade connected to a motor, while the control circuit has means to create variable power levels to the motor. The appliance may be a fan, humidifier, dehumidifier, heater, air purifier, heat exchanger or other such appliance.

According to a fifth aspect of this invention, a control circuit is described which has novel modifications to make it effective with switching motors of various types including a shaded pole motor, a split phase induction motor, a capacitor start motor and a permanent split capacitor motor. Such modifications address the problem of voltage and current being in varying phase relationships to one another and in providing adequate power for starting the motor.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
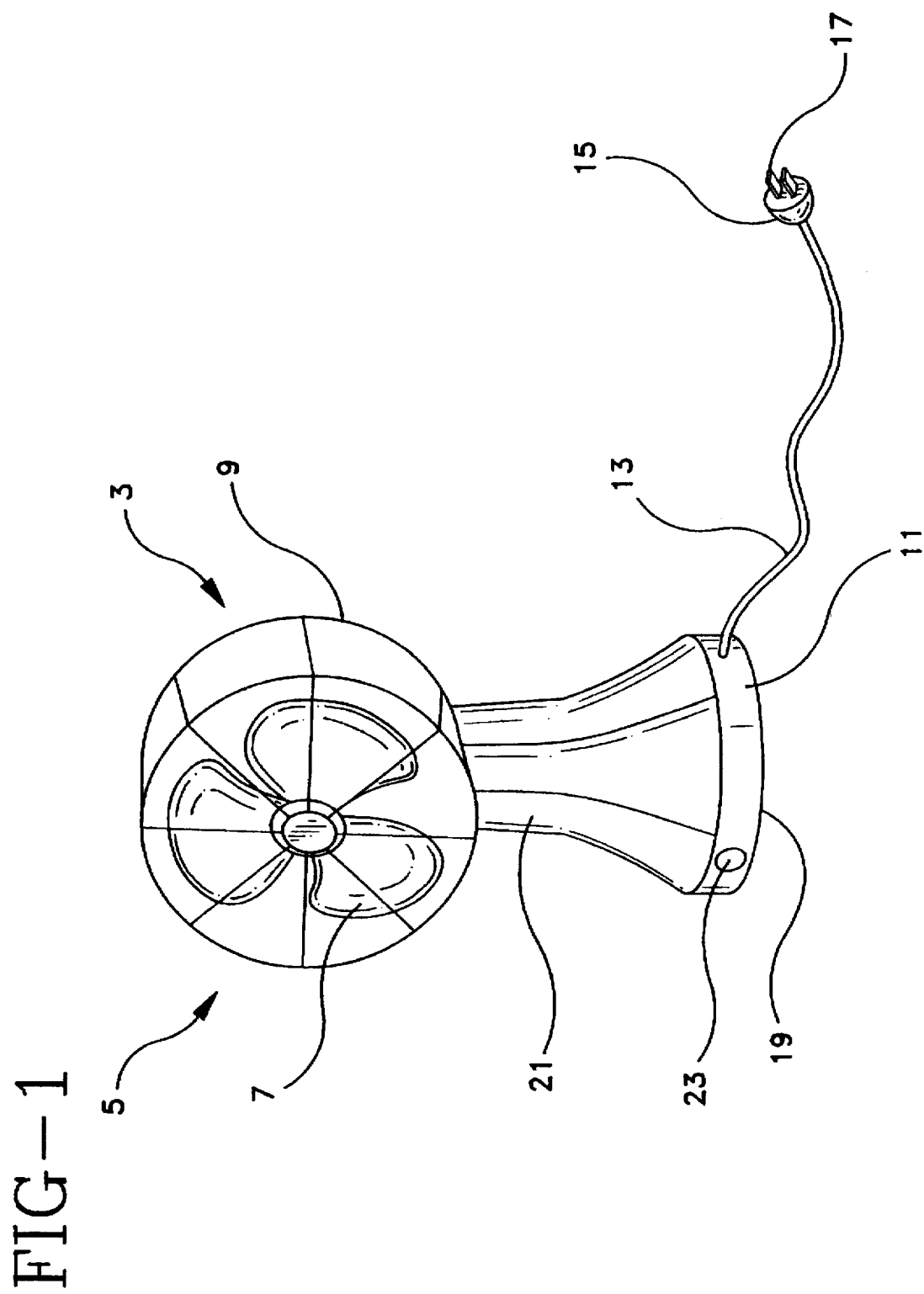
FIG. 1 shows a from perspective view of a fan in combination with an internal touch control system according to an embodiment of the present invention.

Referring now to FIG. 1, a fan 3 according to a preferred embodiment of the present invention is shown. A fan unit 5 and a fan blade 7 are surrounded by a blade housing 9. A base 11 supports fan unit 5 as a power cord 13 extends from base 11 and terminates in a plug 15 having prongs 17 adapted to couple with a conventional power outlet. Base 11 has a bottom side 19 that is flat so that fan 3 may be used on a floor, table, or other flat surface. Fan 3 further includes a static or adjustable neck 21 which can be designed for either floor or table use. Touch pad 23 is mounted upon base 11 to act as an input to the control switch for fan unit 5.

Figure 2:
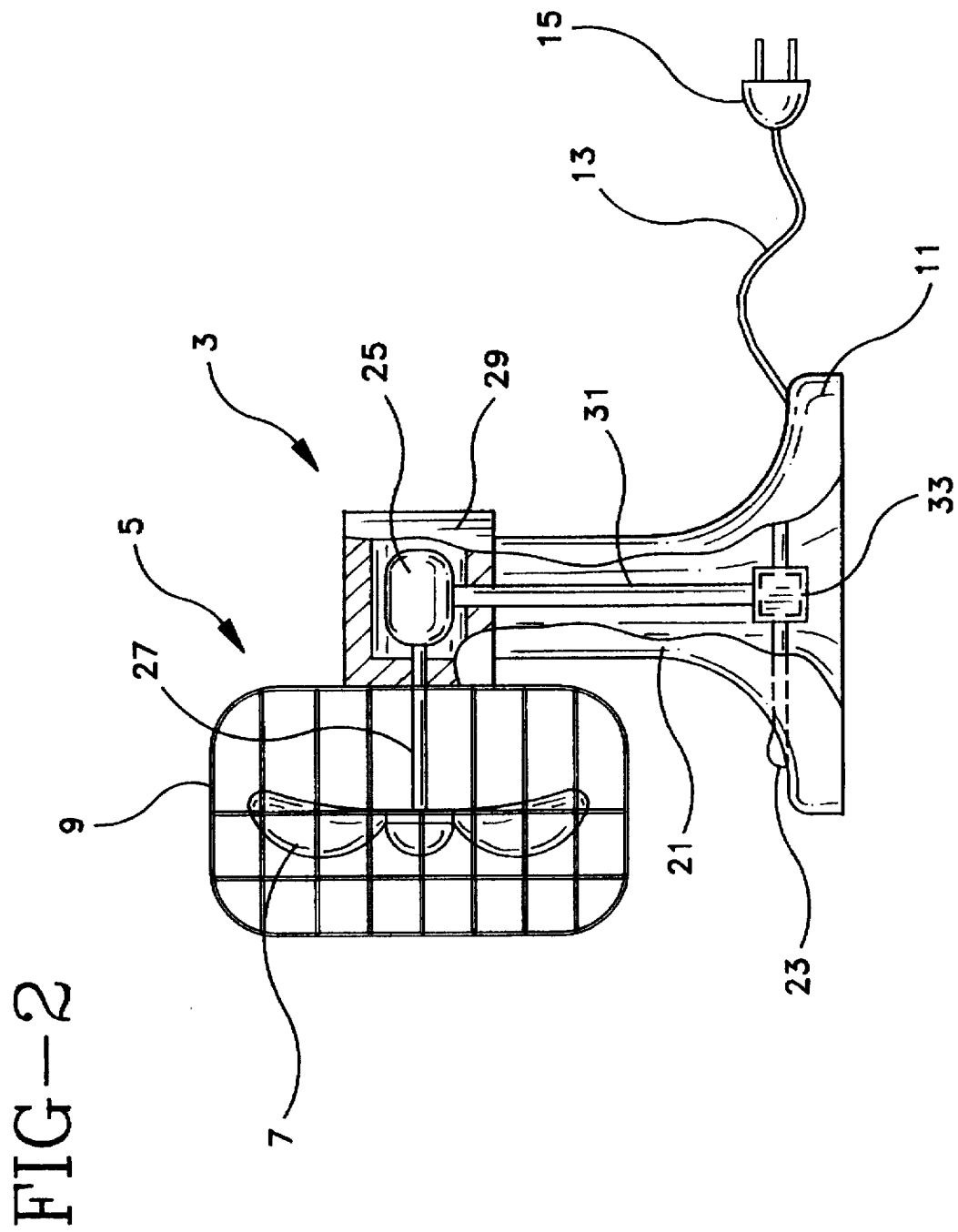
FIG. 2 shows a cut away side elevation view of the fan of FIG. 1.

Referring to FIG. 2, a fan motor 25 is in mechanical contact with and provides rotational energy to blade 7 through a shaft 27 when supplied with actuating power. A motor housing 29 surrounds motor 25 and receives a plurality of conductors 31 through neck 21. Conductors 31 are any electrically conductive elements, preferably at least two insulated copper wires. Conductors 31 provide the electrical contact between motor 25 and a touch control circuit 33 that is housed in base 11. Touch control circuit 33 is in electrical communication with touch pad 23, where any non-trivial contact on touch pad 23 creates a change of state in the control circuit which in turn changes the power delivered to fan unit 5.

Touch pad 23 is any conductive metal plate or semi-conductive material that is capable of conducting low signal levels to the input of the capacitively coupled touch control circuit 33 (usually an oscillator such as one incorporating a bi-stable flip-flop). Although preferably mounted upon base 11, touch pad 23 is alternatively mounted upon motor housing 29 or at any other convenient location within fan 3. Base 11 and motor housing 29 are any conventional material used in fan design and manufacture. Where base 11 or housing 29 is substantially of a non-conductive insulator, such as plastic or other petroleum-based insulator, touch plate 23 is preferably directly connected to the input of the touch control circuit 33. Should base 11 or housing 29 be a conductive metal, touch pad 23 is not necessary and circuit 33 is preferably in direct electrical contact with such base 11 or housing 29. In such a case, a touch anywhere on base 11 or housing 29 suffices to actuate circuit 33 and hence to control motor 25. Although not necessary in the latter described embodiment, electrically conductive touch pad 23 is nevertheless used in either embodiment.

Figure 3:
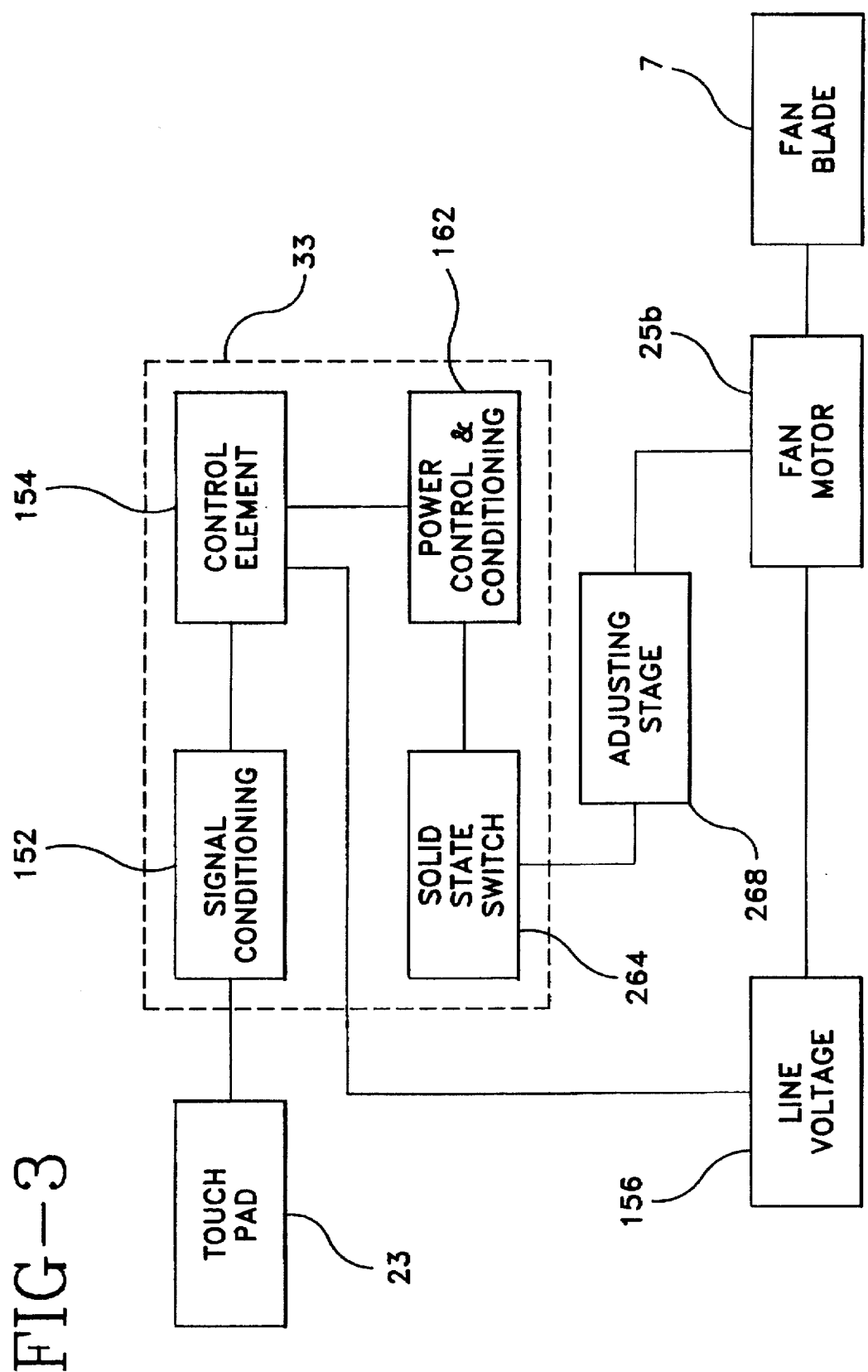
FIG. 3 shows a flow chart describing the serial progression of power transmission and motor activation within an appliance according to an embodiment of the invention.

Referring to FIG. 3, a flow chart describing the serial progression of power transmission and motor activation within the fan is shown. Specifically, a fan motor 25b is turned to an "ON" state from an "OFF" state by the following steps. Touch pad 23 is touched by an object, such as a finger, toe, stick, or rod, thereby activating touch control circuit 33. Touch control circuit 33 includes a signal conditioning element 152 (typically an RC network) and a control element 154. Control element 154 is typically an integrated circuit including a bistable oscillator, a zero-crossing detector, and a phase comparator for providing trigger pulses at appropriate times during the cycle. Touch control circuit 33 further includes a solid state switching element 264 (typically a triac) and a power control and conditioning element 162 (typically an RC or RL network).

The electrical configuration of control element 154 is preferably adapted to provide a stepped or variable power output responsive to touching touch pad 23, thus giving fan motor 25b the feature of a "low", "medium", "high", or similarly stepped or variable settings. Control element 154 is preferably a device such as a touch control dimming device, Model HT7712B or HT7713B, by Holetek Microelectronics Inc.

Control element 154 senses a change in voltage and produces a trigger pulse to power control and conditioning element 162, which in turn turns on solid state switching element 264. Solid state switching element 264 transfers output power through a conditioning or impedance matching adjusting stage 268 to fan motor 25b for rotating fan blade 7. Similarly, fan motor 25b is turned to an "OFF" state by again touching the touch plate 23, thereby creating a state within control element 154 that turns off solid state switching element 264, eliminating output power to fan motor 25b, and thus eliminating rotational power to fan blade 7. Control element 154 is an adaptation of any conventionally known touch control switching systems, including those switches disclosed in U.S. Pat. Nos. 5,166,482, 4,668,876, 4,665,324, and 4,380,040 incorporated herein by reference.

Figure 4:
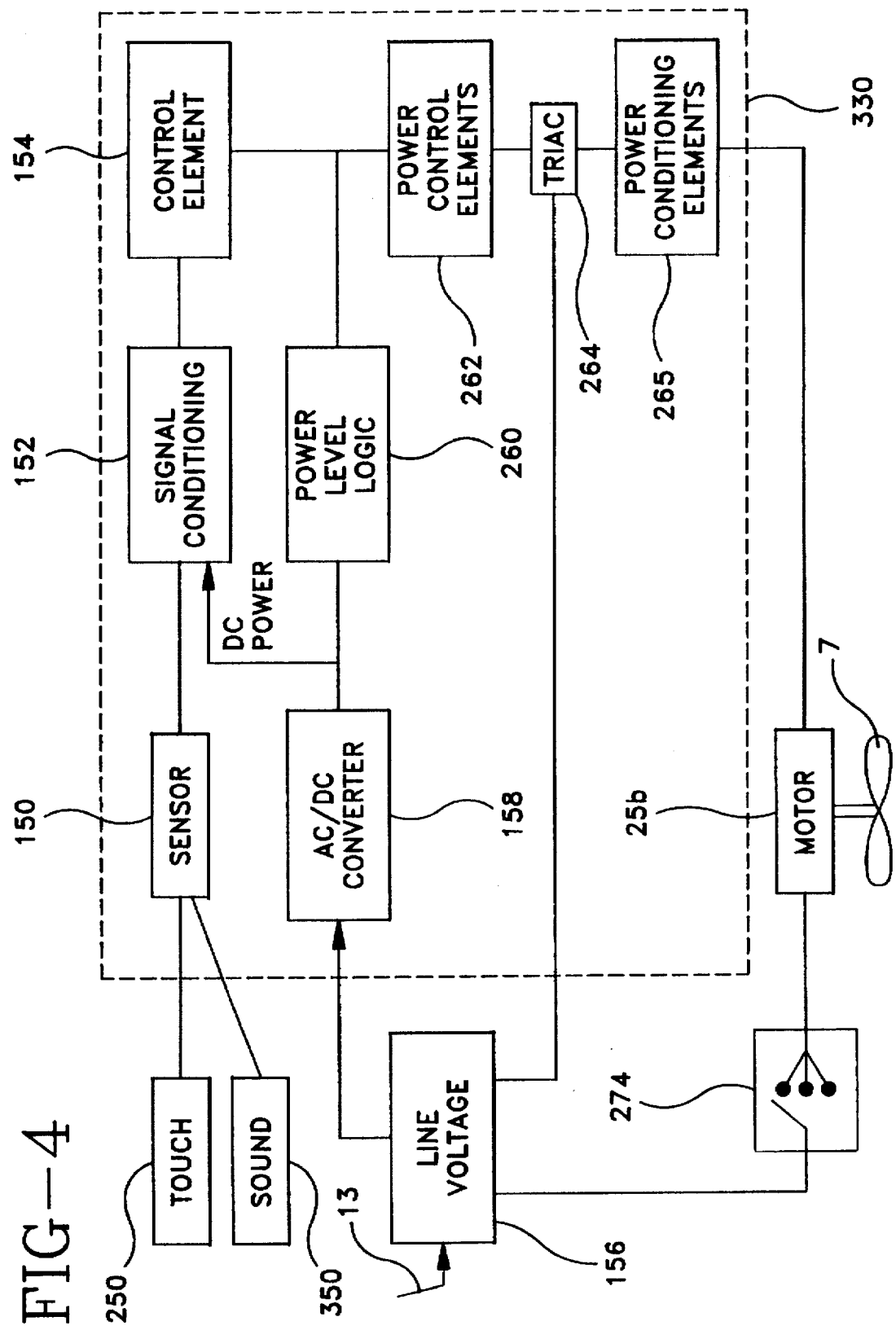
FIG. 4 shows a block diagram of the primary circuit elements for the touch control system according to an embodiment of the present invention.

Referring to FIG. 4, an embodiment of a touch control circuit 330 (outlined by dashed lines) having expanded flexibility is shown. In this embodiment, a sensor 150 is generalized to include the sensing of an intended command, such as a touch by a hand or foot on a touch plate 250 or an audio signal applied to a microphone 350. A signal conditioning element 152 is preferably enhanced to discriminate between an intended command, i.e., a touch on touch plate 250, and random or background noise effects, such as a wave of a hand or passing of a person or pet. Such discrimination is preferably accomplished by digital or analog filtration and using in-time comparisons or comparisons made with stored patterns (as in a memory chip).

A control element 154 includes an integrated circuit including a bi-stable oscillator, a zero-crossing detector, and a phase comparator that provides trigger pulses at appropriate times during the cycle in response to the output of signal conditioning element 152. The output signal may alternatively be modified by input from a power level logic chip 260 that counts the number of touches on touch plate 250 and accordingly varies the power delivered to other elements within touch control circuit 330, such as a power control element 262, a power conditioning/impedance matching element 265, and the current that eventually is conducted to a fan motor 25b. A solid state switch 264, such as a triac, is disposed between fan motor 25b and power control element 262, where power control element 262 serves to supply the "ON" and "OFF" impulse for solid state switch 264. A power level logic element 260 is connected to a line voltage source 156 through an AC/DC converter circuit 158. Logic element 260 further controls power control element 262 in its control of solid state switch 264.

A power conditioning/impedance matching element 265 is preferably used to compensate for phase shifts and voltage drops produced by inductive or capacitive loads. One objective of maintaining a proper phase relationship between various circuit elements is to achieve a high power factor or efficiency of converting electrical to rotational mechanical energy. Touch control circuit 330 is typically inoperable when used with inductive loads absent power conditioning/impedance matching elements 265. This function is preferably accomplished using a permanent split capacitor AC motor. Other variations are required when using a shaded pole motor, a permanent split capacitor (PSC) motor, a capacitor start motor, a split phase induction motor or other various types of motors.

The electrical configuration of control element 154 is alternatively adapted to provide a stepped or variable power output responsive to touching touch pad 23, thus giving fan motor 25b the feature of a "low", "medium", "high", or similarly stepped or variable settings.

An electro-mechanical switch 274 provides variable power levels to fan motor 25b by providing varying resistances in a divider network for different positions. In this instance, logic elements 260 and much of power control element 262 could be eliminated. Switch 274 may also provide an optional "ON-OFF" override to touch control circuit 330.

Sensor 150 preferably includes any conventionally known touch control switch, including those switches disclosed in U.S. Pat. Nos. 5,166,482, 4,668,876, 4,665,324, 4,380,040, and 3,666,988, each of which is expressly incorporated herein by reference. Alternative embodiments of sensor 150 include various conductance sensors, a capacitive proximity sensor, an inductive proximity sensor, a voice sensor 350, such as a microphone or other sound-wave sensor, an ultrasound sensor, a light sensor (ranging in spectral sensitivity from visible to far infrared), or an electromagnetic spectrum sensor such as a radio frequency sensor. If some sensor 150 other than a touch pad is used, then appropriate adjustments will be required in the signal conditioning (detection/filter) element 152 of the circuit so that signal levels and shapes are suitable for triggering the next stage, the control element oscillator 154.

Figure 5:
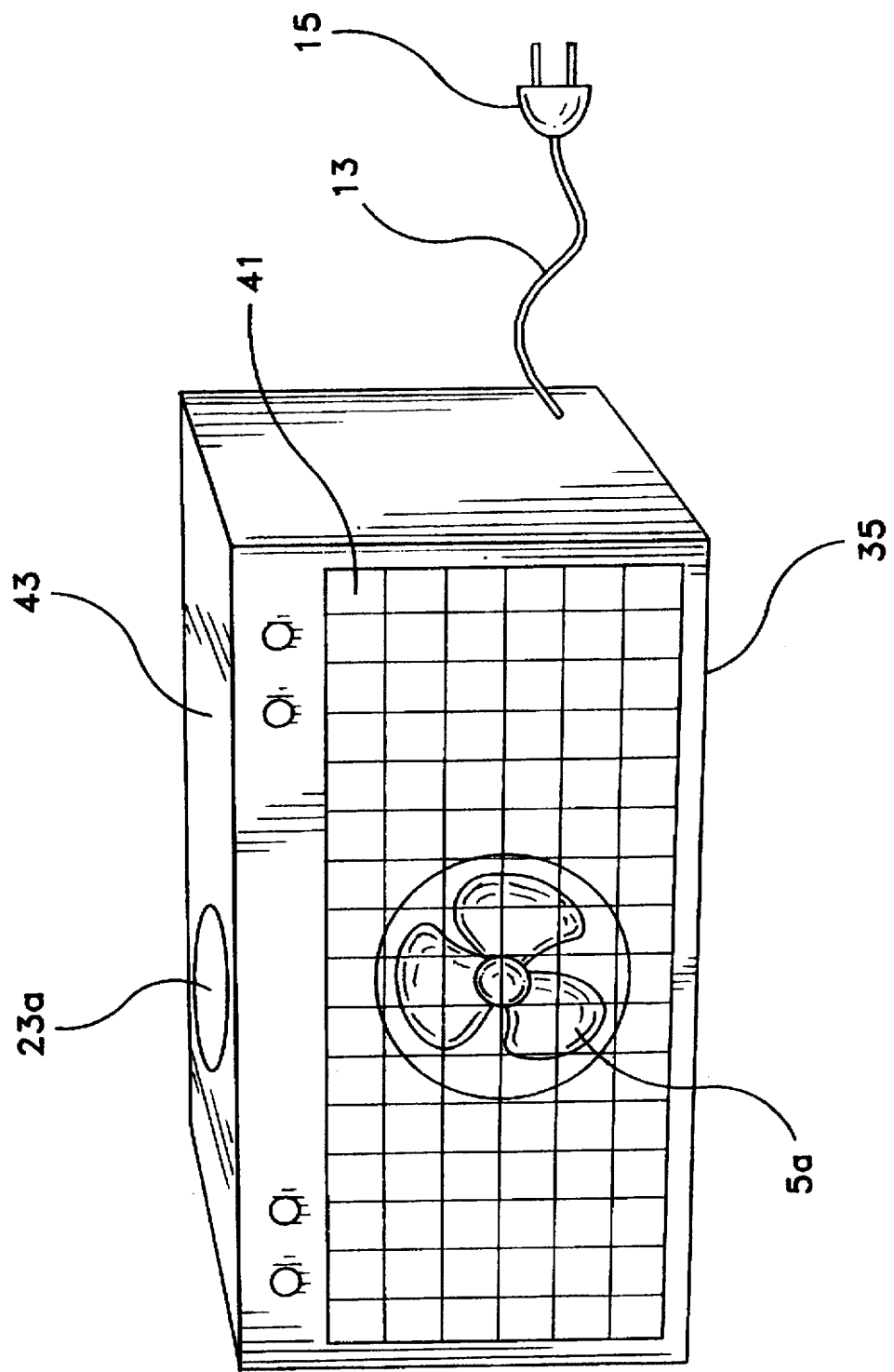
FIG. 5 shows a front perspective view of the touch control fan of the present invention in combination with an appliance.

Referring to FIG. 5, an alternative embodiment of a touch control fan unit 5a in combination with an appliance 35 is shown. Appliance 35 is any appliance such as a humidifier, dehumidifier, heater, air purifier, air conditioner, or fan. For simplicity, other associated elements of appliance 35 not pertinent to the invention are not shown or discussed. If appliance 35 includes a plastic or other non-conductive housing 43, then a special conducting plate or region 23a is provided for connection to the touch sensitive circuitry.

Figure 6:
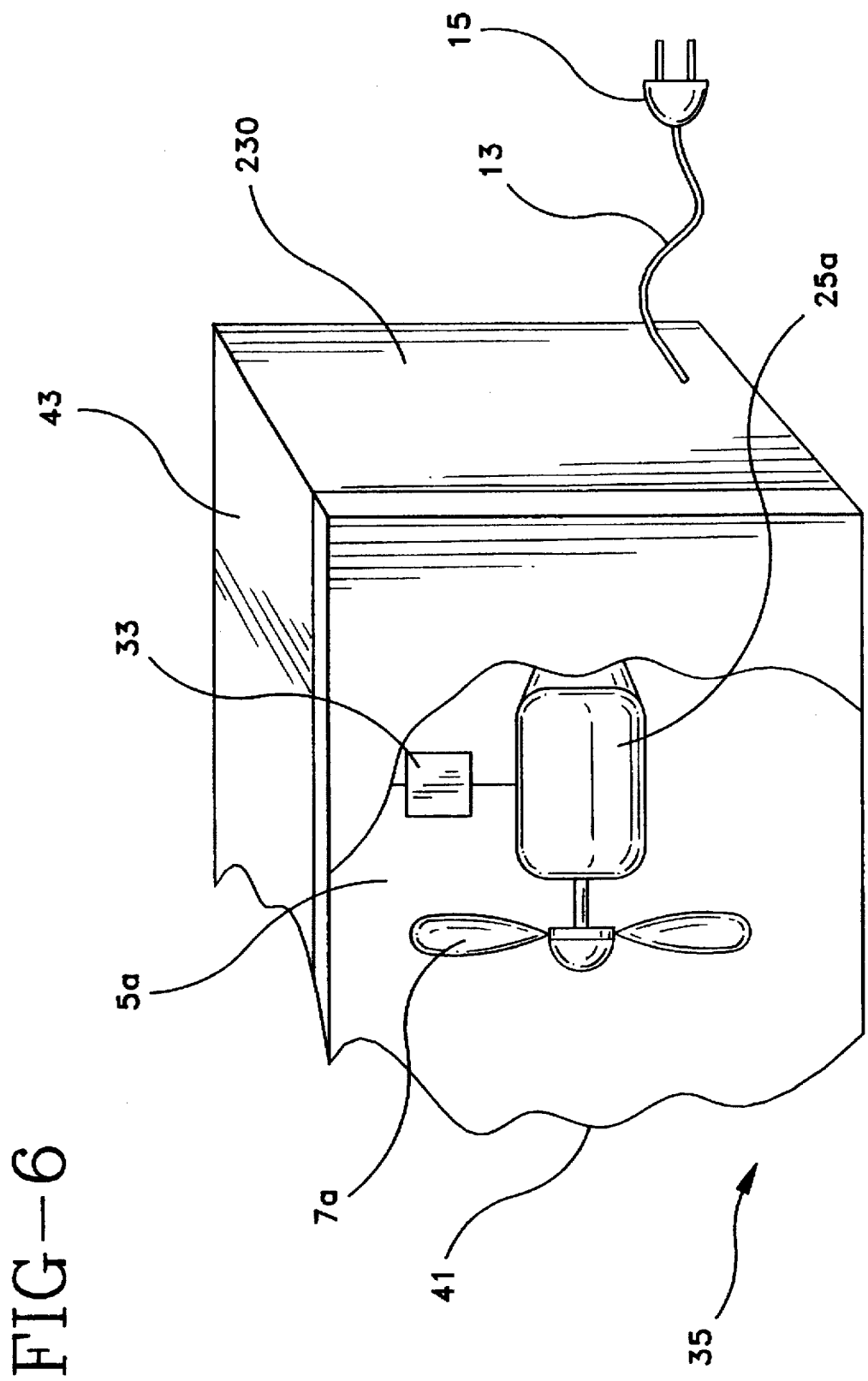
FIG. 6 shows a side perspective view, broken away in part, of the appliance of FIG. 5.

Referring also to FIG. 6, appliance 35 includes a fan unit 5a enclosed by a non-conductive housing 43 that has openings such as a grille 41 to allow unencumbered air circulation. Fan unit 5a includes a fan blade 7a and a fan motor 25a that is in electrical communication with the output of a touch control circuit 33 which is similarly within appliance 35. In this embodiment, a contact area is alternatively provided as a conducting stylized band 230 which is mounted upon an external surface of housing 43 at any convenient position where it is in electrical communication with the input to touch control circuit 33. In an alternative embodiment in which the appliance casing is made of a conductive material, any touch on the casing actuates touch control circuit 33 which in turns actuates the motor for the fan unit 5a. Fan unit 5a within appliance 35 therefore serves to effectuate the underlying function of appliance 35. The appliance receives its electrical power through a conventional power cord 13 which is plugged into a standard electrical outlet via a conventional two or three pronged plug 15.

Figure 7:
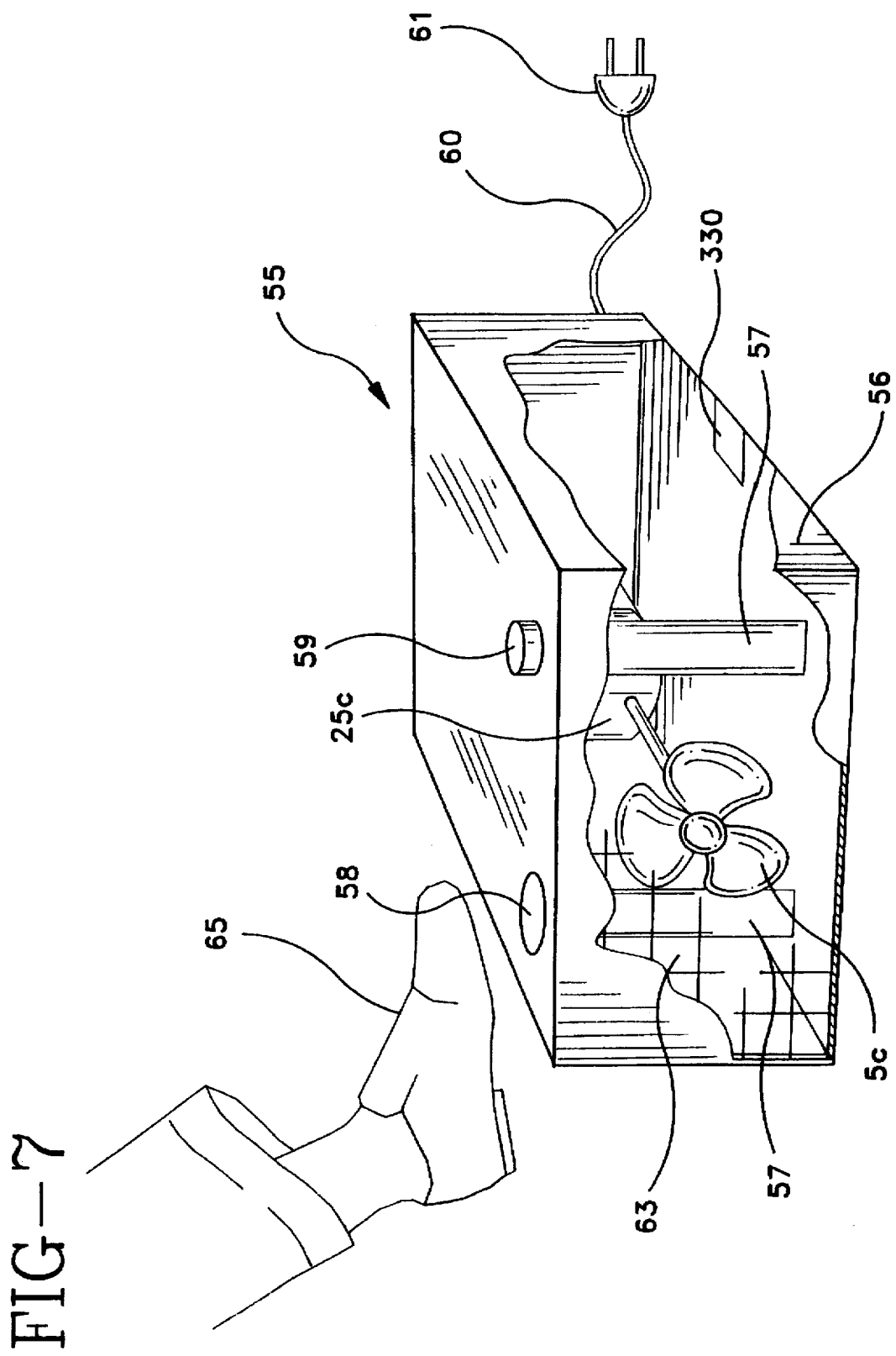
FIG. 7 shows a front perspective view of an alternative embodiment of the present invention in which a heater and fan combination rests on the floor and is controllable by a foot of a person.

Referring to FIG. 7, an alternative embodiment of the present invention is shown. A heating appliance 55 includes a housing 56, a front grill 63 (shown cut away), one or more heating elements 57 in combination with a fan 5c and a motor 25c which in turn is controlled by a touch pad 58 connected to a touch control circuit 330. An indicator light 59 indicates whether heating appliance 55 is on or off. Touch control circuit 330 must now not only control fan 5c but also heating elements 57. Touch control circuit 330 is preferably tuned so that mere proximity of an object such as a foot 65 to heating appliance 55 is sufficient to change its state. This feature provides a strong advantage and safety feature when wanting to turn heating appliance 55 off. A conventional power cord 60 and plug 61 are also depicted.

Figure 8:
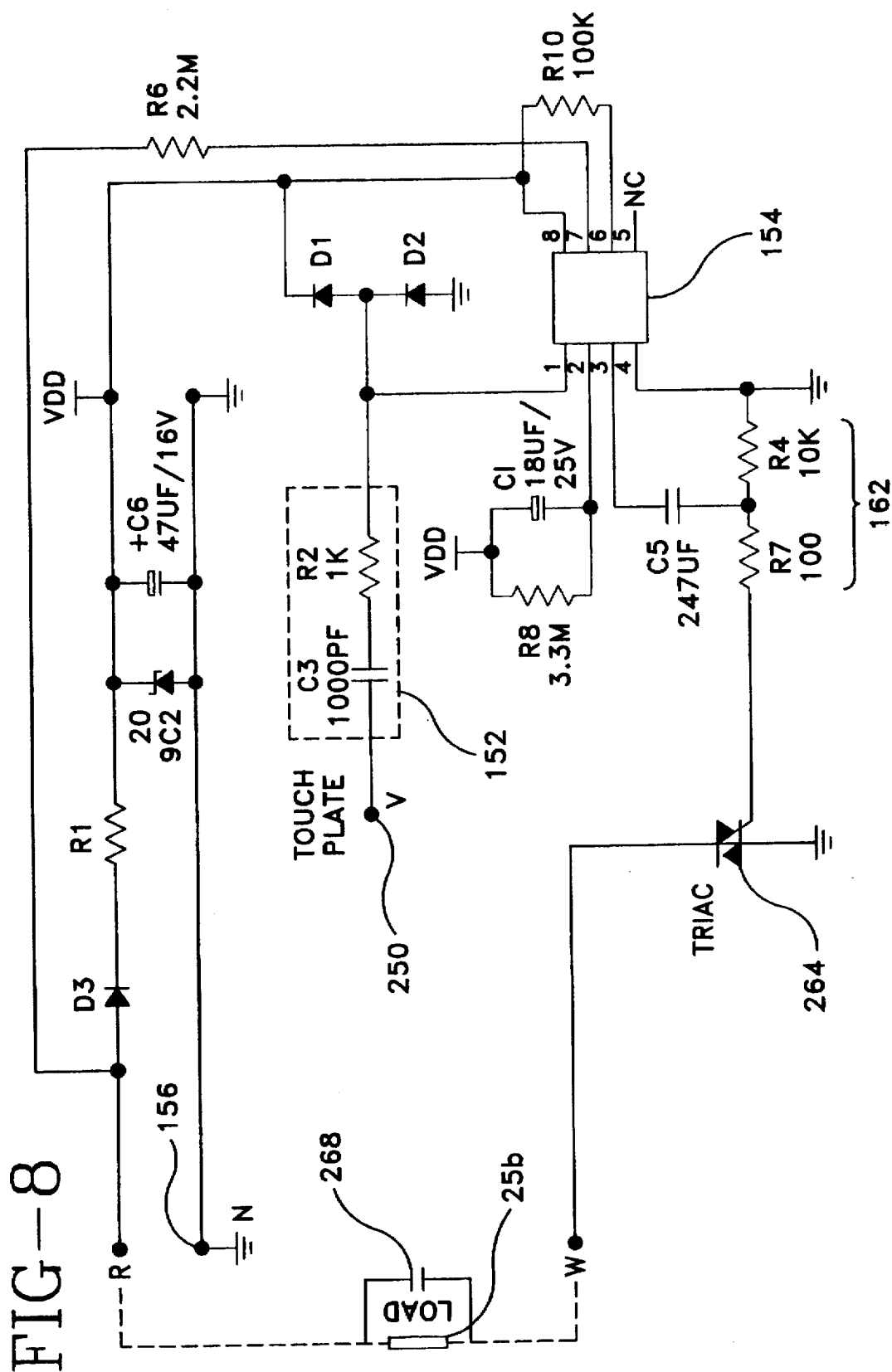
FIG. 8 shows a circuit diagram of the primary circuit elements for the touch control system of the present invention providing component values.

Referring to FIG. 8, a circuit diagram of the primary circuit elements for touch control circuit 33 is shown. A touch plate 250, a small conductive strip on a surface of the appliance, is electrically coupled through a signal conditioning element 152, here shown as an RC network, to control element 154. Control element 154, in response to a change in input on pin 1 and a matching timing signal from the zero-cross input on pin 7, and in conjunction with an internal phase comparator, provides power through power control and conditioning element 162, preferably an RC conditioning circuit, to solid state switch 264, preferably a triac, which in turn drives fan motor 25b.

In developing a touch control circuit for a shaded pole motor of the type used in fans, it was found that an excessive load is placed on the triac and other circuit components since the power factor is less than 0.7, indicating a substantial phase difference between voltage and current. This excessive load causes potential early failure of the circuit. When using motors, or pairs of motors, drawing large currents of 3 to 10 amperes, an additional heat sink is required on the triac and associated elements 162, 264, and 154 to dissipate the heat generated. During testing, an initial triac used, a Phillips Components Ltd. BT134, was not sufficient to handle the power transfer. Units were running hot and failing the High Potential Test of the Underwriters Laboratories. This problem is preferably resolved by using a triac with a higher rating (6 amps instead of 4 amps), such as a Phillips Components Ltd. BT136, in combination with a heat sink.

Adjusting stage 268 is preferably a phase correction capacitor across the shaded pole motor for improving the power factor and providing reliable operation of touch control circuit 33. Alternatively, touch control circuitry works with fans if 2, 4, 6, or other multi-pole capacitor type motors are used which have capacitive coupling integral to the motor, either series or parallel, and which have power factors greater than 0.90.

From the foregoing, it is evident that the invention is not limited to any one specific type appliance. Similarly, the invention is not limited to any one specific type of controlling input or circuitry. In addition, the various control elements are so organized so that they may be adjusted to accommodate different motor types including shaded pole, capacitance start, permanent split capacitor, split phase inductive, and others.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A control circuit for an inductive load, comprising:
 means for receiving an input from a sensor;
 means for filtering spurious signals in said input;
 means for conditioning, responsive to said means for filtering, an output power signal;
 said means for conditioning said output power signal including means for adjusting a phase and impedance of said output power signal to match said inductive load;
 means for controlling said means for conditioning said output power signal; and
 means for switching, responsive to said means for controlling, said output power signal for transferring said output power signal to said inductive load.

2. A circuit according to claim 1, wherein said means for filtering spurious signals in said input includes an RC network.

3. A circuit according to claim 1, wherein said means for controlling includes means for providing varying power levels of said output power signal, ranging from zero percent to 100 percent, to said inductive load.

4. A circuit according to claim 1, wherein:
 said input is sound; and
 said means for controlling, responsive to said input, including means for changing voltage levels of said output power signal to said inductive load.

5. A circuit according to claim 1, wherein said means for conditioning said output power signal is one of an active and passive network containing at least one of L, R, and C elements.

6. A circuit according to claim 5, wherein said network includes means for altering a phase relationship between current and voltage to increase a power factor in said output power signal.

7. A circuit according to claim 1, wherein said inductive load includes one of shaded pole, permanent split capacitance, capacitance start, and split phase inductance electric motor.

8. A circuit according to claim 1, wherein said means for controlling said means for conditioning includes an oscillator having a frequency dependent upon an input capacitance to the circuit.

9. A circuit according to claim 1, wherein said means for switching includes a multiple pole electro-mechanical switch having varying values of resistance in a voltage divider network.

10. A circuit according to claim 1, wherein:
 said input is electromagnetic waves; and
 said means for switching said output power signal includes means, responsive to said input, for changing voltage levels in said output power signal.

11. A sensor controlled electrical appliance, comprising:
 an inductive load;
 a sensor;
 means for receiving an input from said sensor;
 means for filtering spurious signals in said input;
 means for conditioning, responsive to said means for filtering, an output power signal;
 said means for conditioning said output power signal including means for adjusting a phase and impedance of said output power signal to match said inductive load;
 means for controlling said means for conditioning said output power signal; and
 means for switching, responsive to said means for controlling, said output power signal for transferring said output power signal to said inductive load.

12. An appliance according to claim 11, wherein said sensor includes one of a special conducting and semiconducting pad on a surface of said appliance and such pad is electrically connected to said means for conditioning and said means for controlling.

13. An appliance according to claim 11, wherein a surface of said appliance is constructed of materials having sufficient conductivity so that an extended part of said surface is said sensor.

14. A control circuit for an inductive load, comprising:

means for receiving an input from a sensor;

means for filtering spurious signals in said input;

means for conditioning, responsive to said means for filtering, an output power signal;

said means for conditioning said output power signal including means for adjusting a phase and impedance of said output power signal to match said inductive load;

means for controlling said means for conditioning said output power signal;

means for switching, responsive to said means for controlling, said output power signal for transferring said output power signal to said inductive load;

said means for filtering spurious signals in said input including an RC network;

said means for controlling including means for providing varying power levels of said output power signal, ranging from zero percent to 100 percent, to said inductive load;

said means for controlling, responsive to said input, including means for changing voltage levels of said output power signal to said inductive load;

said means for conditioning said output power signal including one of an active and passive network containing at least one of L, R, and C elements; and said network including means for altering a phase relationship between current and voltage to increase a power factor in said output power signal.

15. An appliance according to claim 11, wherein said means for conditioning said output power signal alters a phase relationship between a current and a voltage in said output power signal to increase a power factor in said signal.

* * * * *